(12) United States Patent
Zhao et al.

(10) Patent No.: US 6,555,396 B1
(45) Date of Patent: Apr. 29, 2003

(54) METHOD AND APPARATUS FOR ENHANCING ENDPOINT DETECTION OF A VIA ETCH

(75) Inventors: Ailian Zhao, Austin, TX (US); John A. Iacoponi, Austin, TX (US); Thomas E. Spikes, Jr., Round Rock, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/097,159

(22) Filed: Mar. 13, 2002

Related U.S. Application Data

(63) Continuation of application No. 09/533,828, filed on Mar. 23, 2000, now abandoned.

(51) Int. Cl.$^7$ ............................................... H01L 21/00
(52) U.S. Cl. ......................... 438/8; 438/706; 438/714
(58) Field of Search ..................... 438/5, 8, 9, 699, 438/700, 702, 706, 710, 714

(56) References Cited

U.S. PATENT DOCUMENTS

| | | | | |
|---|---|---|---|---|
| 4,648,173 A | * | 3/1987 | Malaviya | .................... 257/517 |
| 5,668,045 A | * | 9/1997 | Golland et al. | ...... 148/DIG. 12 |
| 6,117,778 A | * | 9/2000 | Jones et al. | .................. 438/692 |
| 6,200,887 B1 | * | 3/2001 | Balasubramaniam et al. | ........................... 438/299 |

OTHER PUBLICATIONS

Merriam Webster's Collegiate Dictionary, tenth edition, p. 14.*

* cited by examiner

*Primary Examiner*—Benjamin L. Utech
*Assistant Examiner*—Kin-Chan Chen
(74) *Attorney, Agent, or Firm*—Williams, Morgan & Amerson

(57) ABSTRACT

A method is provided to enhance endpoint detection during via etching in the processing of a semiconductor wafer. The method includes forming a first process layer and a second process layer above the first process layer. A first masking layer is formed above at least a portion of the second process layer, leaving an outer edge portion of at least the second process layer exposed. Thereafter, an etching process is used to remove the outer edge portion of the first and second layers. Once the etching is complete, the first masking layer is removed, and a second masking layer is formed above the second process layer. The second masking layer is patterned to expose portions of the first process layer, and then an etching process substantially removes the exposed portions of the first process layer to form the vias.

29 Claims, 3 Drawing Sheets

METHOD AND APPARATUS FOR ENHANCING ENDPOINT DETECTION OF A VIA ETCH

This is a continuation of application Ser. No. 09/533,828 filed Mar. 23, 2000, now abandoned.

BACKGROUND OF THE INVENTION

1. Field of the Invention

This invention generally pertains to semiconductor processing, and, more particularly, to forming vias through process layers formed above a semiconducting substrate.

2. Description of the Related Art

The manufacture of semiconductor devices generally involves the formation of various process layers, selective removal or patterning of portions of those layers, and deposition of yet additional process layers above the surface of a semiconducting substrate. The substrate and the deposited layers are collectively called a "wafer." This process continues until a semiconductor device is completely constructed. The process layers may include by way of example insulation layers, gate oxide layers, conducting layers, layers of metal or glass, etc.

A significant portion of this process involves the formation of holes or vias through one or more of the process layers to a surface of an underlying process layer. As shown in FIG. 1, these vias 10 are typically formed by placing a mask layer 12 over a surface 13 of a partially formed semicondutor device 14. An open region 16 in the mask layer 12 leaves at least a portion of a layer 18 exposed. The exposed portion of the layer 18 is subjected to an etching process, such as a chemical or plasma etch, which removes the layer 18 generally within the open region 16. It is desirable that the layer 18 be completely removed, substantially exposing an underlying or stop layer 19. The via 10 is subsequently filled with, for example, a conductive material, such as a metal, to provide electrical communication with the underlying layer 19.

In FIG. 2, the via 10 has been formed by selectively exposing the device 14 to an etching process. Those skilled in the art will appreciate that the duration of the etching process may vary depending upon, among other things, the thickness of the layer 18. Generally, the duration of the etching process is an engineering design decision based on approximations that may not adequately account for the non-uniformity of the layer 18 and other processing variables, such as wafer coverage of the layer 18, the non-uniformity of the etching process, and the like. In this embodiment, a portion of the stop layer 19 has been removed during the etching process. The degree to which the etching process is continued after the layer 18 is completely removed is called overetch. The amount of overetch is illustrated by the distance "X."

In FIG. 3, the via 10 has been formed by selectively exposing the device 14 to an etching process. Again, the duration of the etching process may be an engineering design decision based on approximations. In this embodiment, a portion of the layer 18 was not removed from the via 10. The degree to which the layer 18 is not completely removed is called incomplete etch. The amount of incomplete etch is illustrated by the distance "Y."

Unfortunately, because of the possible non-uniformity and other processing variables, determining duration times for various etching processes is extremely difficult. Generally, when processing a wafer it is desirable to minimize overetch and incomplete etch. For example, it may be undesirable to overetch unnecessarily because the underlying layer 19 is typically thinned during overetch, which may result in a decreased production yield. In addition, incomplete etch of wafers may also result in a decreased production yield, as electrical communication with the underlying layer 19 may be impaired.

A variety of techniques have been developed to detect the time at which the layer 18 has been substantially removed. One such technique involves detecting the presence of the underlying layer 19 by monitoring the surrounding gases. That is, as the etch process begins to remove the underlying layer 19, the material from which the layer 19 is constructed begins to appear in the surrounding atmosphere. Once a sufficient amount of this material appears in the atmosphere, it is assumed that the overlying layer 18 has been substantially removed.

As shown in FIG. 4, a top view of a wafer 30 illustrates that, while thousands of vias 10 may be present on a wafer 30, they collectively account for a very small portion of the surface area of the wafer 30. In some instances, the vias 10 account for substantially less than 1% of the wafer surface area. Thus, as the etching of the vias 10 progresses into the underlying layer 19, a relatively small amount of material from the layer 19 is introduced into the atmosphere. Detecting this small quantity of material from the underlying layer 19 is exacerbated by the introduction of this same material from other sources.

An outer edge 34 of the wafer 10 may have regions where the surface of the underlying layer 19 may be exposed or where the underlying layer 19 is covered by only a relatively thin layer 12. In fact, in some cases the exposed outer edge 34 may account for 2–3% of the surface area of the wafer 30. That is, the surface area of the outer edge 34 is substantially greater than the surface area of the vias 10. Thus, detecting an endpoint of the via etch by detecting the presence of the underlying layer 19 may be difficult because of the relatively small impact that the vias 10 will have on exposing the underlying layer 19. That is the existence of materials on the outer edge 34 of the wafer 10 that is the same as the material comprising the underlying layer 19 may make endpoint detection difficult during via etching processes.

The present invention is directed to a semiconductor processing method that addresses some or all of the aforementioned problems.

SUMMARY OF THE INVENTION

In one aspect of the present invention, a method is provided that is used in processing a semiconductor wafer. The method includes: forming a first process layer; forming a second process layer above the first process layer; forming a first masking layer above at least a portion of the second process layer, leaving an outer edge portion of at least the second process layer exposed; and performing an etching process to remove the outer edge portion of the first and second layers.

In another aspect of the present invention, a method is provided that is used in processing a semiconductor wafer. The method includes: forming a first process layer; forming a first masking layer above at least a portion of the first process layer, the first masking layer having an outer edge; and performing at least one etching process to remove the first process layer extending beyond the edge of the first masking layer.

BRIEF DESCRIPTION OF THE DRAWINGS

The invention may be understood by reference to the following description taken in conjunction with the accompanying drawings, in which like reference numerals identify like elements, and in which.

Figure 1:
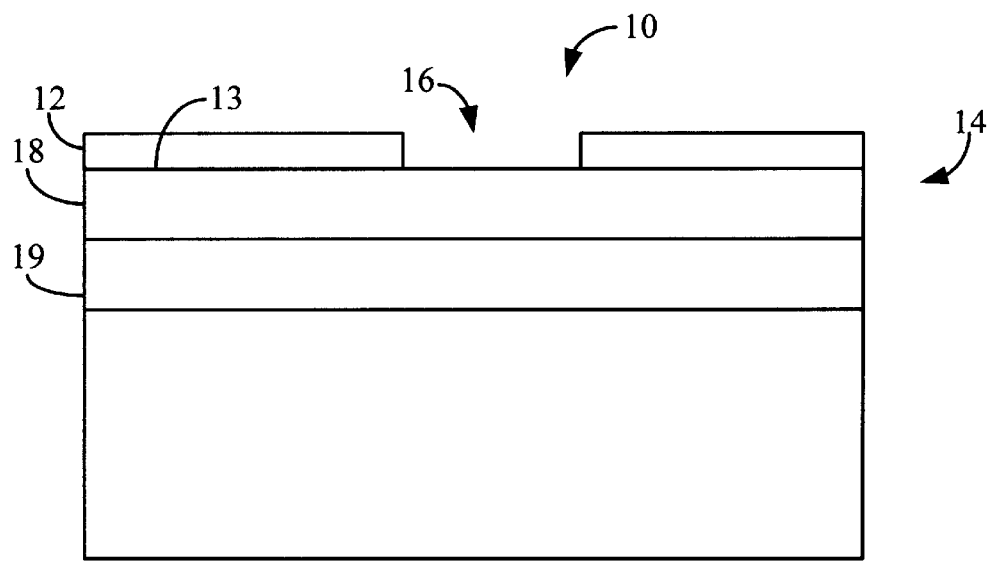
FIG. 1 is a cross-sectional view of a semiconductor device prepared for a via etch process.
Figure 2:
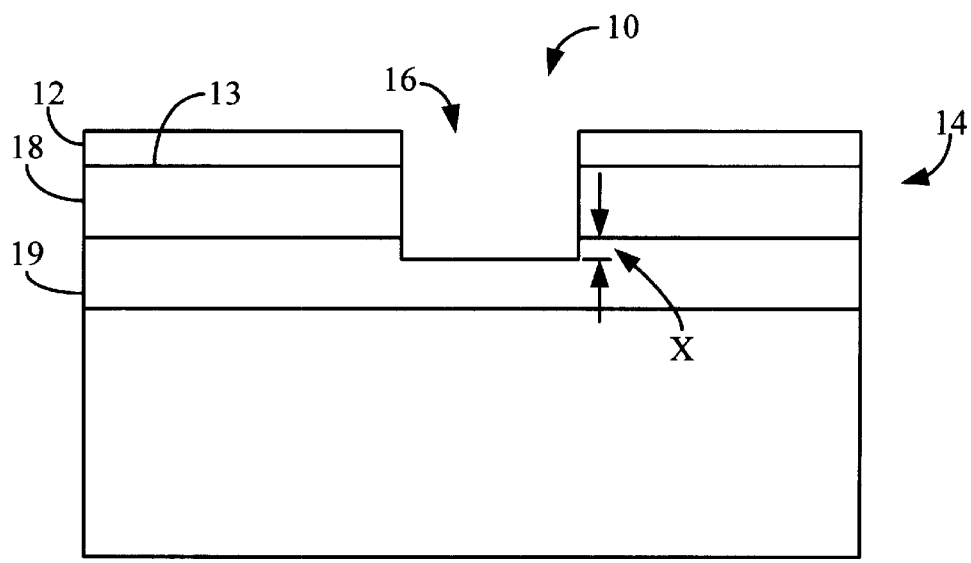
FIG. 2 is a cross-sectional view of the semiconductor device of FIG. 1 with an overetched via disposed therein.
Figure 3:
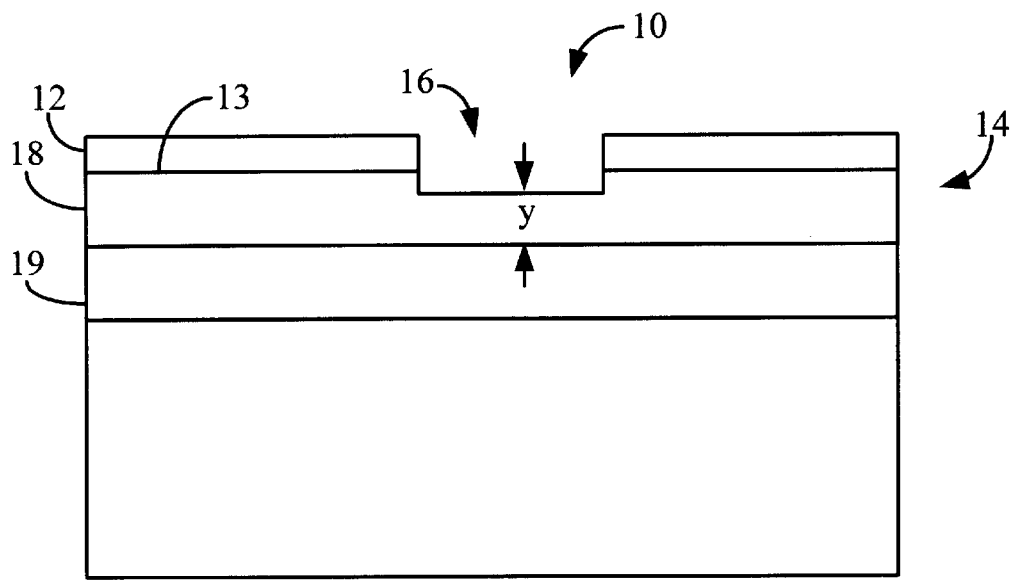
FIG. 3 is a cross-sectional view of the semiconductor device of FIG. 1 with an incompletely etched via disposed therein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort, even if complex and time-consuming, would be a routine undertaking for those of ordinary skill in the art having the benefit of this disclosure.

One method and apparatus useful for detecting via endpoint etch is discussed in detail in copending U.S. patent application Ser. No. 09/476,875 entitled feed-forward control of an etch processing tool filed contemporaneously herewith, which is incorporated by reference herein in its entirety. The method and apparatus described in this copending application may be used in conjunction with the methodology described herein to enhance the detection of via endpoint etch.

The present invention will now be described with reference to FIGS. 5A, 5B, and 6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of enhancing the accurate formation of vias in a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 4:
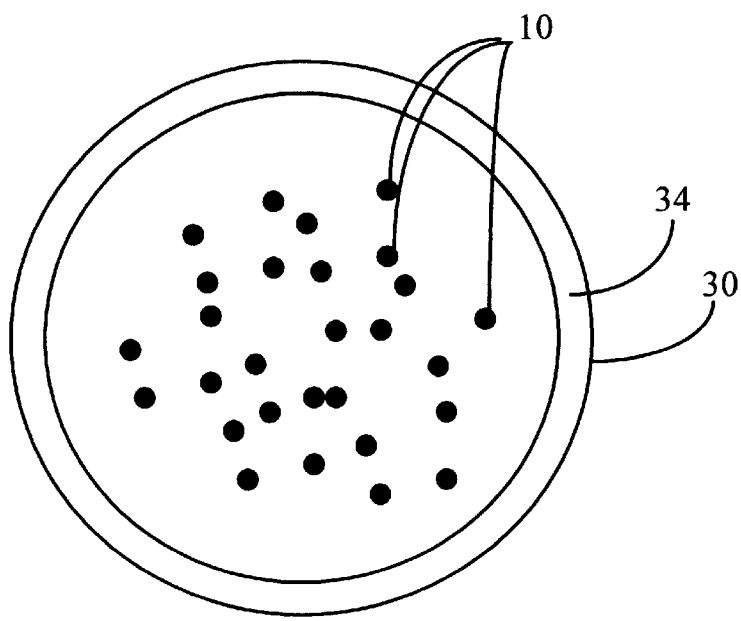
FIG. 4 is a top view of a semiconductor wafer.
Figure 5A:
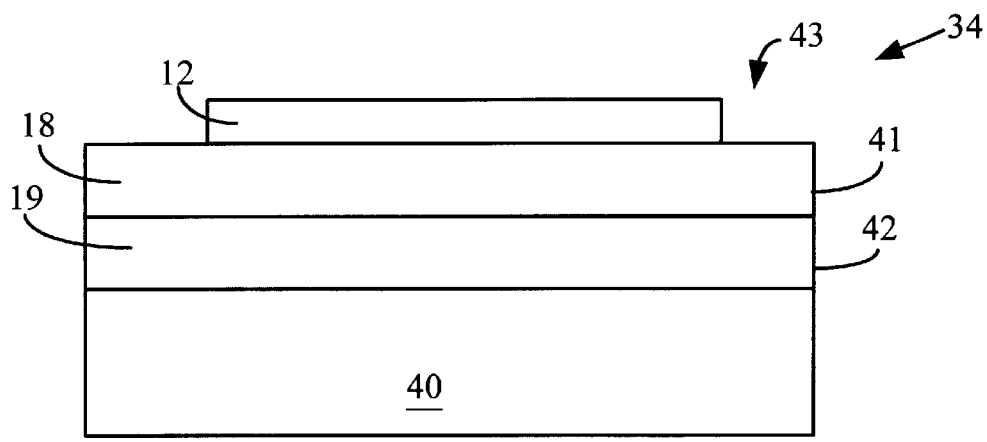
FIGS. 5A and 5B are cross-sectional views of the of the semiconductor wafer of FIG. 4 taken adjacent an edge thereof.

Referring now to FIG. 5A, a cross-sectional view of the semiconductor wafer 30 of FIG. 4 taken adjacent the edge 34 thereof is shown. A substrate 40 has the layers 18, 19 applied thereto. Edges 41, 42 of the layers 18, 19 may or may not be aligned. Thus, the layer 19 may extend beyond the overlying layer 18 so that the layer 19 is at least partially exposed. Under these circumstances, etching of the vias 10 will cause an immediate etching of the underlying layer 19 adjacent the edge 34 of the wafer 30. The layers 18, 19 can be any of a wide variety of materials, including, for example, oxides, nitrides, silicon, metals, and the like. Assuming for purposes of illustration that the layer 19 is a nitride and the layer 18 is an oxide, then etching of the vias 10 should progress through the oxide layer 18 and into the nitride layer 19, stopping when the presence of the nitride layer 19 is detected in the atmosphere. However, nitride may appear in the atmosphere well before the etching of the vias 10 is complete because of the immediate etching of the nitride layer 19 adjacent the edge 34 of the wafer 30.

Figure 5B:
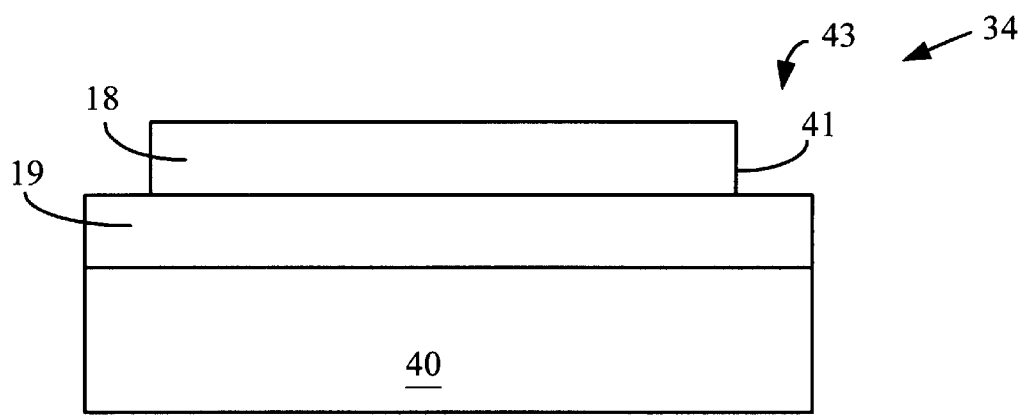
Figure 6:
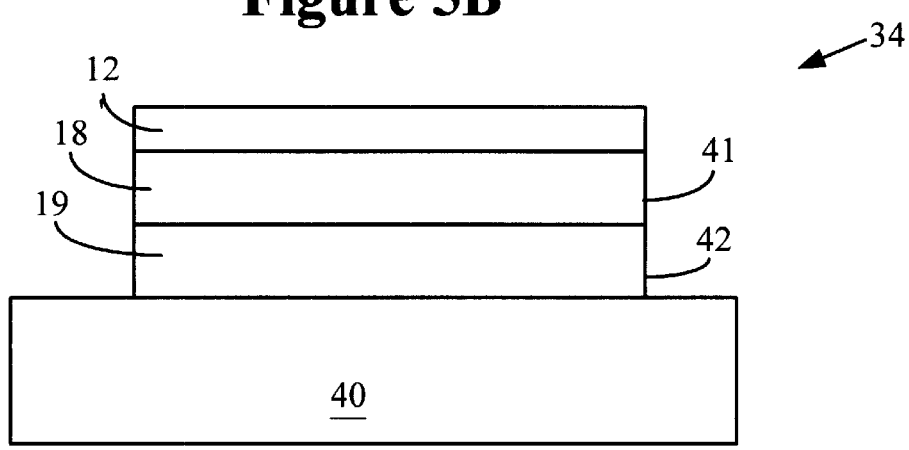
FIG. 6 is a cross-sectional view of the of the semiconductor wafer of FIG. 4 taken adjacent an edge thereof after an edge bead removal process.

In the embodiment disclosed in FIGS. 5A, 5B, and 6, erroneous indications of a completed via etch may be reduced by "cleaning up" the edge region 34 prior to performing the via etch. As shown in FIG. 5A, the process begins by applying a mask, such as a layer of photoresist 12, over the surface of the layer 18. Through masking and developing techniques well known to those of ordinary skill in the field of semiconductor processing, an outer circumference of the photoresist 12 may be removed, leaving an outer ring 43 of the layers 18, 19 exposed. In one embodiment, the outer ring 43 of the layers 18, 19 may have a dimension in the range of 2–3 mm, but may be larger or smaller as dictated by the physical characteristics of the wafer 30 being processed.

With the outer ring 43 exposed, the wafer 30 may be subjected to a conventional etching process, similar to the via etch. That is, the ring 43 of the layer 18 is substantially removed by an etch process, such as a chemical or plasma etch. For example, in the case where the layers 18, 19 are respectively an oxide and a nitride, the etch process may include carbon containing fluorine species. Thereafter, as shown in FIG. 5B, the photoresist 12 may be removed, and a new photoresist layer 12' may be applied to the upper surface of the layer 18, as shown in FIG. 6. An additional etch process may now be performed to remove the layer 19, thereby ensuring that the edges 41, 42 of the layers 18, 19 are now aligned.

Although in the illustrated embodiment both of the layers 18, 19 are removed, all that may be recuired is to remove the layer comprised of the same material as the etch stop layer 19.

As shown in FIG. 6, the etch process has removed the outer ring 43 of the layers 18, 19 to an underlying layer, which in the depicted embodiment is the substrate 40. It should be appreciated that additional layers (not shown) may exist intermediate the layer 19 and the substrate 40 without departing from the spirit and scope of the instant invention. The additional intermediate layers (not shown) may or may not be removed, as dictated by the material from which they are constructed. As long as the intermediate layers are not constructed from a material that will affect the detection of the via endpoint etch, then they need not be removed.

Alternatively, it is not necessary that both of the layers 18, 19 be etched at the same time. For example, in one embodiment it may prove useful to etch the outer ring 43 of the layer 19 prior to forming the layer 18. Thereafter, if necessary, the outer ring 43 of the layer 18 may be etched away. It may also be possible to skip the etch step for the layer 18 if coverage of the etched layer 19 by the subsequently applied layer 18 is ensured. That is, etching the layer 19 before forming the layer 18 may ensure that the subsequently applied layer 18 substantially completely covers the underlying layer 19. Assuming relatively complete coverage of the layer 19, the problem associated with erroneous detection of the underlying material in the atmosphere may be reduced or even eliminated.

At this point, to continue with the via etch process, the photoresist layer 12 may be removed and replaced with an appropriately patterned new photoresist layer (not shown) that includes openings for the vias 10. A description of the process used to form the photoresist layer is not provided herein because it is well within the knowledge of a person of ordinary skill in the field of semiconductor processing, and to provide such details may serve to obscure applicants invention. An etch process, such as the type described in copending application No. 09/476,875, may be performed to form the vias 10 throughout the wafer 30. Since the edge 34 of the wafer 30 no longer has an exposed portion of the underlying layer 19, etching of the layer 19 should only occur at the locations of the vias 10. Thus, the presence of the material from the layer 19 in the atmosphere should more accurately reflect the completion of the via etch process. Moreover, since the edge 34 of the wafer 10 no longer contains portions of the underlying layer 19, the endpoint may be more easily detected due to the fact that material from the layer 19 due to the formation of the vias 10 will not be overwhelmed by the existence of similar materials due to the etching of the layer 19 at the edge region 34.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method used in processing a semiconductor wafer, comprising:
   forming a first process layer above the wafer;
   forming a second process layer above said first process layer;
   forming a first masking layer above at least a portion of said second process layer, leaving an outer edge portion of at least said second process layer exposed in a region adjacent an outer edge portion of the wafer; and
   performing an etching process to remove said outer edge portion of said first and second layers.

2. A method, as set forth in claim 1, including:
   removing said first masking layer;
   forming a second masking layer above said second process layer;
   patterning said second masking layer to expose portions of said first process layer; and
   performing an etching process to substantially remove said exposed portions of said first process layer.

3. A method, as set forth in claim 2, wherein patterning said second masking layer includes forming a plurality of openings and wherein performing the etching process further comprises forming vias below said plurality of openings.

4. A method, as set forth in claim 2, including;
   detecting the presence of said first process layer in an atmosphere about said semiconductor wafer; and
   discontinuing the etching process in response to detecting a preselected magnitude of the second process layer in the atmosphere.

5. A method, as set forth in claim 2, wherein forming the first process layer includes forming a layer of material that includes nitride.

6. A method, as set forth in claim 5, including:
   detecting the presence of said nitride in an atmosphere about said semiconductor wafer; and
   discontinuing the etching process in response to detecting a preselected magnitude of the nitride in the atmosphere.

7. A method used in processing a semiconductor wafer, comprising:
   forming a first process layer;
   forming a second process layer above said first process layer;
   forming a first masking layer above at least a portion of said second process layer, leaving an outer edge portion of at least said second process layer exposed;
   performing an etching process to remove said outer edge portion of said first and second layers;
   removing said first masking layer;
   forming a second masking layer above said second process layer;
   patterning said second masking layer to expose portions of said first process layer; and
   performing an etching process to substantially remove said exposed portions of said first process layer.

8. A method, as set forth in claim 7, wherein patterning said second masking layer includes forming a plurality of openings and wherein performing the etching process further comprises forming vias below said plurality of openings.

9. A method, as set forth in claim 7, including;
   detecting the presence of said first process layer in an atmosphere about said semiconductor wafer; and
   discontinuing the etching process in response to detecting a preselected magnitude of the second process layer in the atmosphere.

10. A method, as set forth in claim 7, wherein forming the first process layer includes forming a layer of material that includes nitride.

11. A method, as set forth in claim 7, including:
    detecting the presence of said nitride in an atmosphere about said semiconductor wafer; and
    discontinuing the etching process in response to detecting a preselected magnitude of the nitride in the atmosphere.

12. A method used in processing a semiconductor wafer, comprising:
    forming a first process layer above the wafer;
    forming a first masking layer above at least a portion of said first process layer, said first masking layer having an outer edge; and
    performing at least one etching process to remove said first process layer extending beyond said outer edge of said first masking layer;

forming a second process layer above said first process layer;

forming a second masking layer above said second process layer;

patterning said second masking layer to expose portions of said first process layer; and performing at least one etching process to remove said exposed portions of said second process layer.

13. A method, as set forth in claim 12, wherein patterning said second masking layer includes forming a plurality of openings and wherein performing the etching process further comprises forming vias below said plurality of openings.

14. A method, as set forth in claim 12, including;

detecting the presence of said first process layer in an atmosphere about said semiconductor wafer; and discontinuing the etching process in response to detecting a preselected magnitude of the second process layer in the atmosphere.

15. A method, as set forth in claim 12, wherein forming the first process layer includes forming a layer of material that includes nitride.

16. A method, as set forth in claim 15, including:

detecting the presence of said nitride in an atmosphere about said semiconductor wafer; and discontinuing the etching process in response to detecting a preselected magnitude of the nitride in the atmosphere.

17. A method used in processing a semiconductor wafer, comprising:

forming a first process layer above the wafer;

forming a first masking layer above at least a portion of said first process layer, said first masking layer having an outer edge; and performing at least one etching process to remove said first process layer extending beyond said outer edge of said first masking layer;

forming a second process layer above said first process layer;

forming a second masking layer above said second process layer, said second masking layer having an outer edge;

performing at least one etching process to remove said second process layer extending beyond said outer edge of said second masking layer.

18. A method used in processing a semiconductor wafer, comprising:

forming a first process layer above the wafer;

forming a first masking layer above at least a portion of said first process layer, the first masking layer being without openings;

patterning the first masking layer to form a solid layer having a first outer edge;

performing at least one etching process to remove the first process layer extending beyond the first outer edge of the solid layer;

forming a second process layer above the first process layer;

forming a second masking layer above the second process layer;

patterning said second masking layer to expose portions of the second process layer; and performing at least one etching process to remove the exposed portions of the second process layer.

19. The method, as set forth in claim 18, wherein forming the second masking layer includes forming the second masking layer with a plurality of openings, wherein patterning the second masking layer includes forming the plurality of openings, and wherein performing the etching process further comprises forming vias below the plurality of openings.

20. The method, as set forth in claim 18, further comprising:

detecting the presence of the first process layer in an atmosphere about the semiconductor wafer; and discontinuing the etching process in response to detecting a preselected magnitude of the first process layer in the atmosphere.

21. The method, as set forth in claim 18, wherein forming the first process layer includes forming a layer of material that includes nitride.

22. The method, as set forth in claim 21, further comprising:

detecting the presence of the nitride in an atmosphere about the semiconductor wafer; and discontinuing the etching process in response to detecting a preselected magnitude of the nitride in the atmosphere.

23. A method used in processing a semiconductor wafer, comprising:

forming a first process layer above the wafer;

forming a second process layer above the first process layer, leaving an outer edge portion of at least the first process layer exposed;

forming a first masking layer above at least a portion of the second process layer; and performing an etching process to remove at least the outer edge portion of the first process layer.

24. The method, as set forth in claim 23, wherein forming the first masking layer above at least the portion of the second process layer comprises forming the first masking layer above substantially all of the second process layer.

25. The method, as set forth in claim 23, including:

removing the first masking layer;

forming a second masking layer above the second process layer;

patterning the second masking layer to expose portions of the first process layer; and performing an etching process to substantially remove the exposed portions of the first process layer.

26. The method, as set forth in claim 25, wherein patterning the second masking layer includes forming a plurality of openings and wherein performing the etching process further comprises forming vias below the plurality of openings.

27. The method, as set forth in claim 25, further comprising:

detecting the presence of said first process layer in an atmosphere about said semiconductor wafer; and discontinuing the etching process in response to detecting a preselected magnitude of the second process layer in the atmosphere.

28. The method, as set forth in claim 25, wherein forming the first process layer includes forming a layer of material that includes nitride.

29. The method, as set forth in claim 28, further comprising:

detecting the presence of the nitride in an atmosphere about the semiconductor wafer; and discontinuing the etching process in response to detecting a preselected magnitude of the nitride in the atmosphere.

* * * * *

UNITED STATES PATENT AND TRADEMARK OFFICE
CERTIFICATE OF CORRECTION

PATENT NO. : 6,555,396 B1
DATED : April 29, 2003
INVENTOR(S) : Zhao et al.

It is certified that error appears in the above-identified patent and that said Letters Patent is hereby corrected as shown below:

Column 4,
Line 54, replace "recuired" with -- required --.

Signed and Sealed this

Nineteenth Day of August, 2003

JAMES E. ROGAN
*Director of the United States Patent and Trademark Office*